United States Patent
Braithwaite (10) Patent No.: US 6,985,706 B2
(45) Date of Patent: Jan. 10, 2006

(54) FEED FORWARD AMPLIFIER SYSTEM EMPLOYING SELF-GENERATING ALIGNMENT LISTS AND ADAPTIVE CONTROLLER

(75) Inventor: Richard Neil Braithwaite, Orange, CA (US)

(73) Assignee: Powerwave Technologies, Inc., Santa Clara, CA (US)

( * ) Notice: Subject to any disclaimer, the term of this patent is extended or adjusted under 35 U.S.C. 154(b) by 33 days.

(21) Appl. No.: 10/761,788

(22) Filed: Jan. 21, 2004

(65) Prior Publication Data

US 2004/0152433 A1   Aug. 5, 2004

Related U.S. Application Data

(60) Provisional application No. 60/442,099, filed on Jan. 23, 2003.

(51) Int. Cl.
    H04B 1/16   (2006.01)
(52) U.S. Cl. ............ 455/194.2; 455/136; 455/323
(58) Field of Classification Search ........... 455/194.2, 455/136, 323, 324; 375/296, 297; 330/52, 330/85, 86, 143, 144, 127, 151, 96
    See application file for complete search history.

(56) References Cited

U.S. PATENT DOCUMENTS

| | | | |
|---|---|---|---|
| 4,517,521 A | 5/1985 | Preschutti et al. | |
| 5,049,832 A | 9/1991 | Cavers | |
| 5,323,119 A * | 6/1994 | Powell et al. | 330/151 |
| 5,444,418 A | 8/1995 | Mitzlaff | |
| 5,485,120 A * | 1/1996 | Anvari | 330/151 |
| 5,610,554 A * | 3/1997 | Anvari | 330/52 |
| 5,621,354 A | 4/1997 | Mitzlaff | |
| 5,644,268 A * | 7/1997 | Hang | 330/151 |
| 5,760,646 A | 6/1998 | Belcher et al. | |
| 5,789,976 A | 8/1998 | Ghannouchi et al. | |
| 5,831,478 A | 11/1998 | Long | |
| 5,877,653 A | 3/1999 | Kim et al. | |
| 5,949,283 A | 9/1999 | Proctor et al. | |
| 6,091,297 A * | 7/2000 | Bar-David et al. | 330/149 |
| 6,094,096 A * | 7/2000 | Myer | 330/52 |
| 6,104,241 A | 8/2000 | Cova et al. | |
| 6,111,462 A | 8/2000 | Mucenieks et al. | |
| 6,172,565 B1 | 1/2001 | Chen et al. | |
| 6,259,319 B1 | 7/2001 | Ghanadan | |
| 6,275,106 B1 | 8/2001 | Gomez | |
| 6,356,146 B1 | 3/2002 | Wright et al. | |
| 6,377,119 B1 | 4/2002 | Hays | |
| 6,388,513 B1 | 5/2002 | Wright et al. | |
| 6,424,215 B1 | 7/2002 | Rice | |
| 6,452,446 B1 | 9/2002 | Eisenberg et al. | |
| 6,504,428 B2 * | 1/2003 | Cova et al. | 330/52 |
| 6,556,076 B1 * | 4/2003 | Posner | 330/52 |
| 6,677,817 B2 * | 1/2004 | Posner | 330/52 |
| 6,771,125 B2 * | 8/2004 | Bingham | 330/151 |
| 2002/0027473 A1 | 3/2002 | Hatsugai | |

(Continued)

Primary Examiner—Sonny Trinh
(74) Attorney, Agent, or Firm—Myers Dawes Andras & Sherman LLP.

(57) ABSTRACT

A method and apparatus for rapid alignment of adaptive feed forward power amplifiers are disclosed. Successful alignment settings are correlated with the operating conditions that affect the gain and phase of an amplifier. These operating conditions may include input power level, carrier frequency, temperature, DC supply voltage, or others. The successful alignment settings along with the corresponding operating conditions are stored in a list that is indexed using multi-dimensional attribute vectors. The elements of the list are generated automatically.

50 Claims, 7 Drawing Sheets

U.S. PATENT DOCUMENTS

| | | |
|---|---|---|
| 2002/0044014 A1 | 4/2002 | Wright et al. |
| 2002/0084845 A1 | 7/2002 | Eisenberg et al. |
| 2002/0153951 A1 | 10/2002 | Cavers |
| 2002/0171485 A1 | 11/2002 | Cova |
| 2003/0030490 A1 | 2/2003 | Nanao et al. |
| 2003/0181191 A1 * | 9/2003 | Gentzler ............... 455/344 |

* cited by examiner

FEED FORWARD AMPLIFIER SYSTEM EMPLOYING SELF-GENERATING ALIGNMENT LISTS AND ADAPTIVE CONTROLLER

RELATED APPLICATION INFORMATION

The present application claims the benefit of provisional application Ser. No. 60/442,099 filed Jan. 23, 2003, the disclosure of which is incorporated herein by reference in its entirety.

BACKGROUND OF THE INVENTION

1. Field of the Invention

The present invention relates to RF power amplifiers and amplification methods. More particularly, the present invention relates to feed forward amplifiers and methods for controlling feed forward amplifiers.

2. Description of the Prior Art and Related Background Information

RF amplifiers are devices that attempt to replicate an RF signal present at an input, producing an output signal with a much higher power level. The increase in power from the input to output is referred to as the 'gain' of the amplifier. When the gain is constant across the dynamic range of the input signal, the amplifier is said to be 'linear'. Amplifiers have limited capacity in terms of power delivered because of gain and phase variances, particularly saturation at high power, which makes all practical amplifiers nonlinear when the input power level varies. The ratio of the distortion power generated relative to the signal power delivered is a measure of the non-linearity of the amplifier.

In RF communication systems, the maximum allowable non-linearity of the amplifier is specified by government agencies such as the FCC or the ITU. Because amplifiers are inherently nonlinear when operating near saturation, the linearity requirements often become the limitation on rated power delivering capability. In general, when operating near saturation, the linearity of the amplifier degrades rapidly because the incremental signal power delivered by an amplifier is proportionally less than the incremental distortion power generated.

Various compensation approaches are conventionally applied to reduce the distortion at the output of the system, which in turn increases the rated power delivering capability. The preferred approach is feed forward compensation. In feed forward RF power amplifiers an error amplifier is employed to amplify main amplifier distortion components which are then combined out of phase with the main amplifier output to cancel the main amplifier distortion component. In general, feed forward compensation provides the power capability of the main amplifier and the linearity of the error amplifier.

Feed forward linearization of an amplifier is based on the matching of the gain and phase of parallel RF paths to either cancel the carrier (input) signal (loop 1) or to cancel the distortion (loop 2). The carrier cancellation is usually referred to as the 'loop 1 error', which is an estimate of the distortion of the main amplifier path. The distortion cancellation occurs within loop 2, and uses the loop 1 error to cancel the distortion of the main amplifier. The matching of the gain and phase in the respective loops is referred to as 'loop alignment control'. When the alignment of loop 2 is correct, the distortion at the output is minimized, making the entire feed forward system more linear than the main amplifier alone. When the alignment of loop 1 is correct, the power through the error amplifier (which amplifies the loop 1 error) is limited. In most cases, the loop 1 alignment must be completed before the error amplifier of loop 2 is enabled. This ensures that the error amplifier is not over-driven, a condition that could produce unwanted distortion or device damage.

Most end users of feed forward power amplifiers have specifications limiting the time that the adaptive portion of the feed forward compensation can take to align the loops. As a result, it is important to have good initial alignments when the adaptive controller begins its search for the best (or sufficient) alignment. Some such specifications have times as low as 10 seconds.

In addition, it is important to have good alignment of loop 1 to limit the power entering the error amplifier. However, the loop 1 error power is roughly the product of the input power and the alignment quality (amount of carrier cancellation). As a result, the alignment quality of loop 1 may be modest if the input power is low. If the input power increases abruptly, the loop 1 error power will increase proportionally, potentially over-driving the error amplifier. Although loop 1 will automatically adjust its alignment setting in response to the increase, fast changes in the alignment of loop 1 are preferred because it reduces the transient effect of over-driving the error amplifier.

There have been numerous prior approaches to feed forward linearization, the earliest dating to the 1920's. In earlier approaches, the alignment settings were static, with fixed settings for gain and phase, optimized for nominal operating conditions. Later approaches introduced look-up-tables for compensation of temperature and DC supply variations. Still later, adaptive methods were applied where the misalignments of the loops were measured internally and used for subsequent alignment adjustments. The loop 1 error power was typically used as a measure of the loop 1 misalignment. For measuring loop 2, a pilot signal was typically introduced within loop 1 to act as a 'known distortion'. The detected pilot power at the output of loop 2 measured the misalignment of loop 2. Pilotless methods for measuring the misalignment of loop 2 have been implemented which are based on distortion measurements. In such systems the second loop convergence has significant dependence on the input signal and the distortion created.

Look-up tables have been used in both static and adaptive versions of the feed forward amplifier. They are used, typically, to compensate for temperature or DC supply variations. However, even when look-up tables are used in an adaptive feed forward system, they are used typically to control parts of the system that are not adaptive, such as the front-end voltage-controlled attenuator and phase shifter (which maintain the overall gain or phase of the system). That is, the loop adaptation and the look-up tables are decoupled.

As indicated above, look-up tables in the past have used a fixed structure. The input, such as temperature, is an index to an array. The indices are equally spaced across the range in ascending order, and corresponding alignment settings are stored within the array. This structure is well suited to memory chips because the index is equivalent to an address and the alignment setting is equivalent to the data. However, the look-up tables are usually based on experimental data (calibration) requiring significant time to fill-in the elements of the table. In addition, drift from component aging can make any look-up table obsolete, necessitating a re-calibration.

Another difficulty with look-up tables is that it can be extremely difficult to manage multi-dimensional arrays, which would be required if many operating conditions are present which affect the alignment quality. One can imagine the number of elements present in an equally spaced four-dimensional array. For example, 10 samples per dimension produces 10000 elements.

One technique of managing multiple indexing dimensions is to assume that the effects are separable. Separable conditions would allow the use of individual arrays for each operating condition, and the composite effect would be the sum of the individual adjustments. (Not unlike a Taylor series expansion where the partial derivatives are specified). Unfortunately, this approach is valid only for small (differential) alignment adjustments because any cross-correlation between dimensions is ignored. The largest error would occur at the corners of the multi-dimensional array. For example, a troublesome corner in the temperature, DC supply index space would be high temperature and low voltage. It is these corner locations that are tested, typically, by sophisticated customers for determining if the amplifier is compliant with specifications.

A related problem with the array-based look-up table is the selection of the sampling interval (separation between adjacent indices) within the index space. In general, the sensitivities of the gain and phase settings vary over the index space. The sampling density must be selected based on the most sensitive region of the index space. The remaining regions will be over-sampled. This problem of over-sampling is made more significant for multi-dimensional arrays.

There have been attempts to make look-up tables self-calibrating or self-generating. However, the fixed array structure is difficult to manage. The key problem encountered is 'update fragmentation'. Consider the previously-mentioned four-dimensional array case. When the look-up table is updated, only one element of 10000 is changed. If the source of the degradation is global (due to component drift, for example), then all 10000 elements are affected. However, the changes must propagate as each index is visited. The potential for neighboring indices to have large differences exists, simply because one of the indices is older.

Accordingly, a need presently exists for a system and method for rapid loop alignment control in a feed forward amplifier system which avoids the above noted limitations of the prior art.

SUMMARY OF THE INVENTION

In a first aspect the present invention provides a feed forward amplifier system comprising an input for receiving an RF input signal and a first control loop coupled to the input, the first control loop comprising a main amplifier, a main amplifier sampling coupler, a delay element, and a cancellation combiner. The feed forward amplifier system further comprises a second control loop coupled to the first control loop and comprising a first signal path, a second signal path comprising an error amplifier, and an error coupler coupling the first and second signal paths. An output is coupled to the error coupler. The feed forward amplifier system further comprises means for controlling at least one of the first and second control loops employing an alignment list having a plurality of list elements, each element having an alignment setting and a collection of parameters characterizing the operating condition of the feed forward amplifier system.

In a preferred embodiment of the feed forward amplifier system the first control loop further comprises a gain adjuster and a phase adjuster and each alignment setting employed by the means for controlling may comprise a loop 1 gain adjuster setting and a loop 1 phase adjuster setting. The second control loop may also comprise a gain adjuster and a phase adjuster and each alignment setting employed by the means for controlling may comprise a loop 2 gain adjuster setting and a loop 2 phase adjuster setting. The collection of parameters characterizing the operating condition of the feed forward amplifier system may comprise one or more of temperature, DC power supply, input signal power and input signal carrier frequency. Preferably, the collection of parameters characterizing the operating condition of the feed forward amplifier system is defined as an attribute vector and a distance is defined between any two attribute vectors. The means for controlling obtains a current attribute vector and computes the distance to the attribute vectors of the list elements and selects the list element with the least distance for use as an alignment setting in the control function. The means for controlling may continually measure misalignment of the feed forward amplifier system and an alignment setting is retrieved from the alignment list when the measured misalignment exceeds a predetermined value. The means for controlling employs a selected element as an initial alignment setting and computes a new alignment setting from the initial setting employing an iterative control algorithm. The means for controlling updates the alignment list with a new alignment setting after completing the iterative computation. The distance between closest list element attribute vectors may vary throughout the alignment list.

According to another aspect the present invention provides an adaptive controller for controlling a loop of an amplifier system. The adaptive controller comprises one or more inputs for receiving one or more attribute parameters corresponding to current operating conditions of the amplifier system. The adaptive controller further comprises one or more processors coupled to the one or more inputs, the one or more processors having an associated alignment list and programmed with an alignment list algorithm and a controller algorithm to provide loop adjustment settings to control the loop of the amplifier system. The alignment list algorithm generates the alignment list with adjustment settings computed by the controller algorithm and associates one or more attribute parameters with each adjustment setting.

In a preferred embodiment of the adaptive controller the alignment list algorithm selects an alignment setting from the alignment list for use by the controller algorithm at start up or when the loop becomes sufficiently misaligned. The alignment list algorithm preferably selects an alignment list adjustment setting for use by the controller algorithm by computing the distance between the one or more attribute parameters corresponding to current operating conditions and the attribute parameters associated with each of the alignment settings in the list and selecting the alignment setting corresponding to the attribute parameter with the minimum distance. The distance computation may be weighted with different weights for different attribute parameters. The attribute parameters may comprise one or more of temperature, DC supply voltage, input signal power and input signal carrier frequency. The distance $d_{attr}$ between two sets of attribute parameters "n" and "0", may, for example, be defined by the weighted $L_{inf}$ norm distance measure or the weighted $L_2$ norm distance measure. The adaptive controller may further comprise one or more inputs for receiving alignment data. The one or more inputs for receiving alignment data may, for example, comprise a pilot signal input or an input for loop test data. The adjustment settings may comprise gain adjuster and phase adjuster settings.

According to another aspect the present invention provides a method for controlling an amplifier system having a control loop comprising a control loop input, a first signal path, a second signal path, and a control loop output, at least one of the first and second signal paths including an amplifier. The method comprises providing a list of alignment settings, each alignment setting having an associated operating condition. The method further comprises detecting the current operating conditions of the amplifier system. The method further comprises comparing the current operating conditions to those in the list of alignment settings and selecting the alignment setting associated with the most similar operating condition in the list.

In a preferred embodiment of the method for controlling an amplifier system the relevant operating conditions are configured as a multi-dimensional attribute vector. Comparing the current operating conditions to those in the list of alignment settings may comprise measuring a distance between the current attribute vector and each of the attribute vectors of the list. Selecting the alignment setting associated with the most similar operating condition in the list may comprise determining the attribute vector having the minimum distance from the current operating condition attribute vector. The method may also further comprise computing a new alignment setting employing an iterative loop controller algorithm, wherein the alignment setting associated with the most similar operating condition is used as the initial alignment setting for the adaptive loop controller algorithm. The method may also further comprise updating the alignment list with a new alignment setting computed by the adaptive loop controller algorithm. The size of the alignment list may be dynamic. Also, the spacing of the stored adjustment settings, as defined by the attribute vector distance, preferably varies throughout the list. For example, a higher density of adjustment settings may be provided in regions of the list where the alignment is most sensitive to one or more operating conditions comprising the attribute vector.

According to another aspect the present invention provides a method of maintaining a list of alignment settings of a control loop of an amplifier system, the list comprising a plurality of elements each element having an alignment setting and a set of parameters corresponding to operating conditions of the amplifier system. The method comprises selecting an element of the alignment list and determining the element of the alignment list having the most similar corresponding operating conditions to the selected element. The method further comprises determining if the two elements are sufficiently similar to be considered redundant. The method further comprises deleting the oldest of the two elements of the alignment list if the elements are redundant.

In a preferred embodiment of the method of maintaining a list of alignment settings of a control loop of an amplifier system, selecting an element of the alignment list comprises selecting the oldest element of the list not previously subject to list maintenance processing. Determining the element of the alignment list having the most similar corresponding operating conditions to the selected element may comprise determining a distance measure to the operating condition parameter values of each of the remaining elements of the alignment list and selecting the element having the minimum distance. The distance measure may comprise a weighted difference between parameter values corresponding to operating conditions. The parameters corresponding to operating conditions of the amplifier system may comprise one or more of temperature, DC power supply, input signal power and input signal carrier frequency. Determining if the elements are sufficiently similar to be considered redundant may comprise determining a distance measure between the alignment settings and comparing the alignment distance to a redundant distance threshold. Alternatively, determining if the elements are sufficiently similar to be considered redundant may comprise comparing the distance between the operating condition parameters of the two elements to an outdated distance threshold. The method may also further comprise repeating said list maintenance processing for each element of the alignment list.

According to another aspect the present invention provides a method of generating a hierarchical list of alignment settings of a control loop of an amplifier system. The list comprises a plurality of elements each element having an alignment setting and a corresponding set of parameters corresponding to operating conditions of the amplifier system, and having a hierarchical structure comprising at least two levels. The method comprises selecting an element in a first level of the alignment list. The method further comprises determining the element of the first level of the alignment list having the most similar corresponding operating conditions to the selected element and demoting the oldest of the two elements to a lower level of the hierarchical alignment list.

In a preferred embodiment of the method of generating a hierarchical list of alignment settings of a control loop of an amplifier system, determining the element of the alignment list having the most similar corresponding operating conditions to the selected element comprises determining a distance measure to the operating conditions of each of the remaining elements of the first level of the alignment list and selecting the element having the minimum distance. The method may further comprise determining if the two elements are redundant, wherein the older element is only demoted if the elements are redundant. The method may further comprise repeating the list processing for each level of the hierarchical list. The method of may also comprise deleting the older entry if the list maintenance processing is at the lowest level of the hierarchy. The demoted element is preferably associated as a subset list entry of the redundant element not demoted. An element being demoted and having a subset list is preferably merged with the subset list of a redundant element not demoted.

According to another aspect the present invention provides a method for controlling an amplifier system having a control loop comprising a control loop input, a first signal path, a second signal path, and a control loop output, at least one of the first and second signal paths including an amplifier. The method comprises providing a hierarchical list of alignment settings having at least two levels, each alignment setting having an associated operating condition and some or all of the alignment settings in a highest level having subset alignment settings in a lower level. The method further comprises detecting the current operating conditions of the amplifier system and comparing the current operating conditions to those in the highest level of the hierarchical list of alignment settings. The method further comprises selecting the alignment setting associated with the most similar operating condition in the highest level of the list. The method further comprises comparing the current operating conditions to those in the subset of the selected highest level alignment setting and selecting the alignment setting of the subset with the most similar operating condition. The method further comprises selecting the alignment setting in the higher or lower level having the most similar operating condition to the current operating condition.

In a preferred embodiment the method for controlling an amplifier system comprises repeating the processing for each level of the hierarchical list until the next lower subset is empty. The highest level preferably has a coarser spacing of alignment settings than the lower level. For example, any two alignment settings may have an alignment distance and the highest level has a larger alignment distance between settings than the lower level. The alignment distance may comprise a weighted difference between the adjustment settings. For example, the adjustment settings may comprise a gain adjustment and phase adjustment setting and the weighting may comprise an alignment sensitivity.

Further features and advantages of the present invention are set out in the following detailed description.

DETAILED DESCRIPTION

Figure 1:
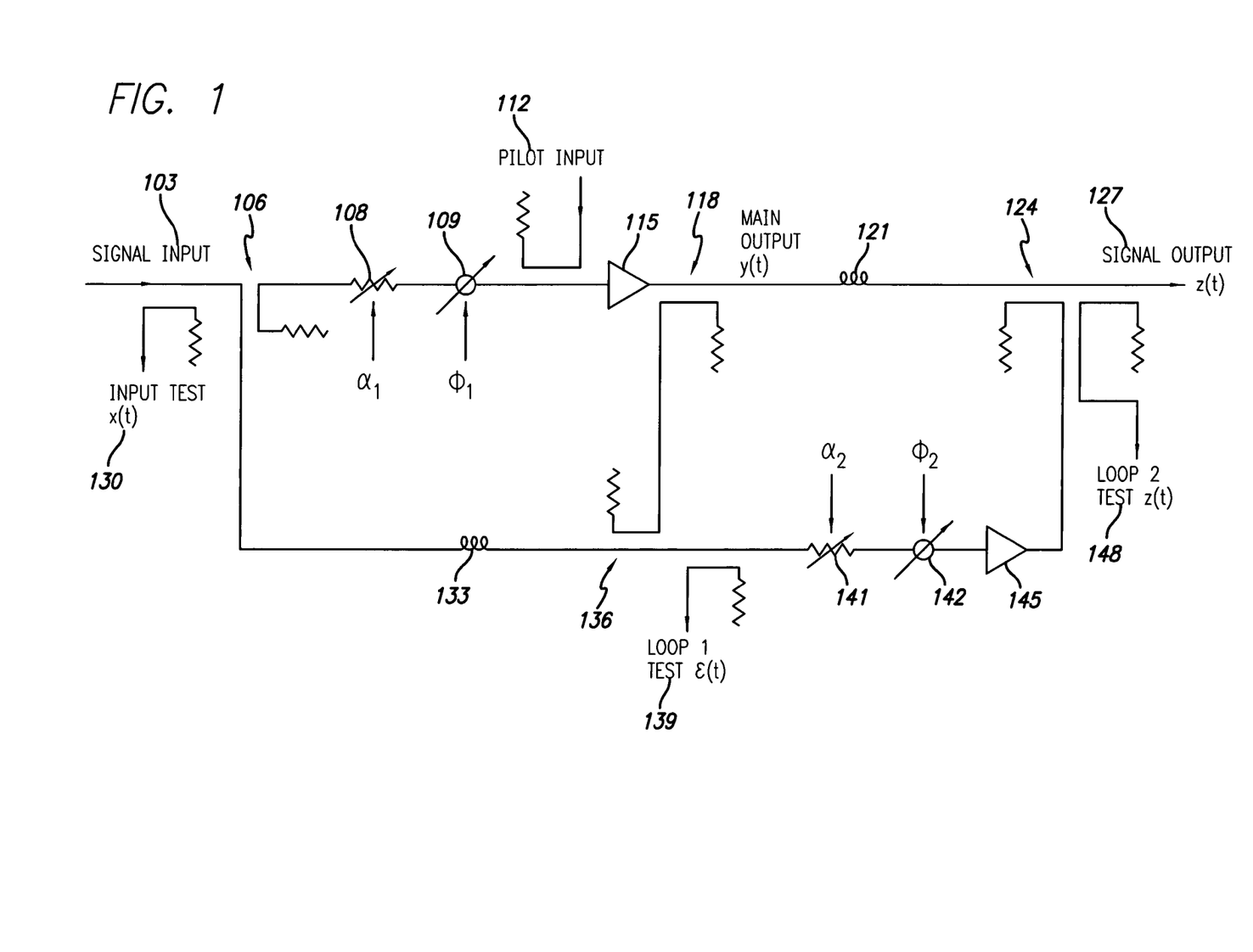
FIG. 1 is a block schematic drawing of a feed forward power amplifier in accordance with the present invention.
Figure 2:
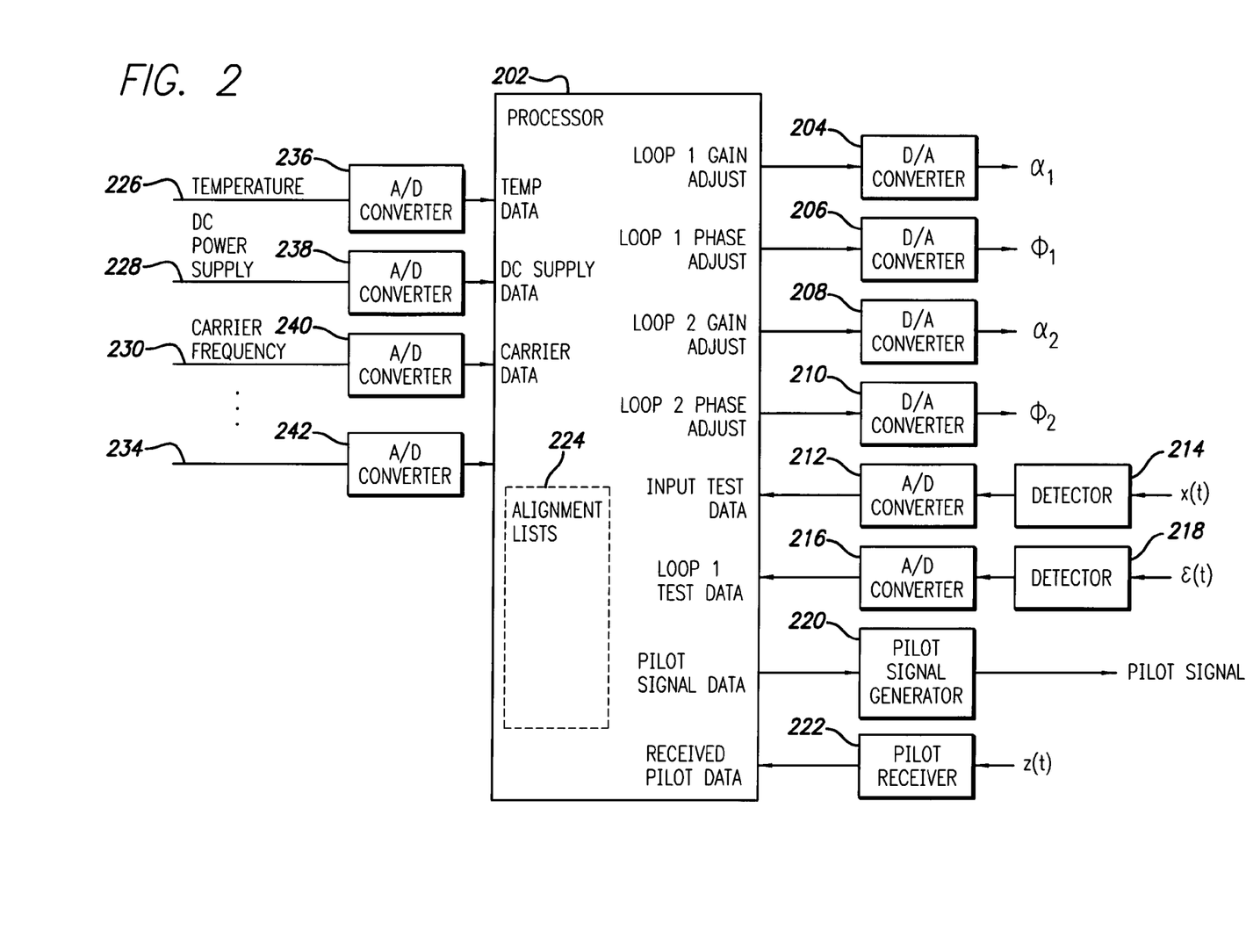
FIG. 2 is a block schematic drawing of a control system of a feed forward amplifier system in accordance with the present invention.

A block diagram of the feed forward compensated power amplifier (PA) system in accordance with a preferred embodiment of the present invention is shown in FIGS. 1 and 2. FIG. 1 illustrates the basic feed forward amplifier and FIG. 2 illustrates the control system.

As shown in FIG. 1, the feed forward amplifier has a conventional architecture employing two control loops. Loop 1 comprises signal input 103, sampling coupler 106, gain adjuster 108, phase adjuster 109, pilot signal input coupler 112, main amplifier 115, main sampling coupler 118, input test coupler 130, delay 133, cancellation combiner 136, and loop 1 test coupler 139. Loop 2 comprises main sampling coupler 118, main path delay 121, error coupler 124, carrier cancellation combiner 136, loop 2 gain adjuster 141, loop 2 phase adjuster 142, error amplifier 145, loop 2 test coupler 148 and output 127. As shown in FIG. 2, the control system may comprise a processor 202 which implements both adaptive controller and alignment list algorithms described in detail below. The alignment lists are stored in a suitable memory 224 and are organized and accessed in a manner described in detail below. Alternatively, separate processors may be provided for the adaptive controller and alignment list functions. Digital to analog converters 204, 206, 208, 210 convert the loop 1 and loop 2 digital gain adjust and phase adjust control signals to analog signals $\alpha_1$, $\phi_1$, $\alpha_2$, $\phi_2$ which are provided to the gain and phase adjusters 108, 109, 141 and 142 (shown in FIG. 1). The processor also receives input test data corresponding to detected input power from input test coupler 130 via power detector 214 and A/D converter 212 and loop 1 test data from loop 1 test coupler 139 via power detector 218 and A/D converter 216. An (optional) pilot generator 220 generates a pilot signal which is provided to pilot signal input coupler 112 (shown in FIG. 1). A pilot signal receiver 222 detects any uncancelled pilot signal from the loop 2 test coupler 148 (shown in FIG. 1) and provides the detected pilot signal in digital form to processor 202. The processor also receives inputs corresponding to current operating conditions of the amplifier system. For example, inputs for temperature, DC power supply, and input RF signal carrier frequency 226, 228, 230 may be provided which are converted to digital form by analog to digital converters 236, 238, 240. Other operating condition inputs 234 may be provided and converted to digital form by A/D converters 242.

First the general principles of operation of the feed forward amplifier system will be described. The adaptive feed forward amplifier control system provides rapid convergence properties by remembering and reusing successful alignment settings. The system has the ability to learn the effect that operating conditions such as temperature, DC supply, input power level, and carrier frequency have on the optimal alignment settings. As a result, the adaptive feed forward amplifier control system can respond to changes in these operating conditions faster than an adaptive controller acting alone.

More specifically, the adaptive controller function of the processor is to measure the misalignment of the feed forward loops and adjust the alignment. The controller adjusts the alignment in an iterative fashion, searching for the minimum alignment error. During the transient period when the search is not complete, the loop misalignment degrades the performance of the feed forward power amplifier and provides excess transient energy, which degrades the linearity of the system. To minimize the transient degradation, good initial alignments are desired. In addition, the potential for instability due to a diverging adaptive controller is reduced by good initial alignments.

To achieve a good initial alignment, the feed forward power amplifier control system processor 202 maintains a list 224 of previous successful alignment settings. Before requesting the use of the adaptive controller, the processor 202 searches the alignment list for a past alignment setting used under similar operating conditions. The operating conditions are represented as a multi-dimensional attribute vector. The attribute 'distance', defined below, is computed by comparing the present attributes with the stored values. In some cases, the initial alignment from the list will provide sufficient cancellation thereby avoiding the use of the adaptive controller.

The attribute distance is also used to predict changes in the state of the feed forward power amplifier system. When abrupt changes in the current attribute vector are detected, the feed forward power amplifier system adjusts its task scheduling. (Note that the term 'current' is used throughout this document to describe 'present time' and should not be interpreted as 'electron flow'). Maintenance tasks are exited in favor of loop alignment, with the loop 1 alignment receiving the highest priority.

The loop 1 alignment involves the control of adjustment settings of the gain adjuster 108, which may be a voltage variable attenuator (VVA) or a controlled gain device, and the phase shifter 109, denoted by $\alpha_1$ and $\phi_1$, to minimize the power detected at 'loop 1 test, $\epsilon(t)$' within FIG. 1. The adaptive control function of loop 1 may employ conventional techniques or the approach of U.S. patent application Ser. No. 10/733,087 filed Dec. 11, 2003 may be employed, the disclosure of which is incorporated herein by reference in its entirety. For loop 2, the alignment control may minimize the intermodulation (IMD) spurs detected at 'loop 2 test, z(t)'. Optionally, a pilot tone 112 is injected before the main amplifier 115 to act as a known distortion, making loop 2 alignment control easier. For example, use of pilot tones for loop control of a feed forward power amplifier (PA) is disclosed in U.S. Pat. No. 5,796,304 to Gentzler et al., the disclosure of which is incorporated herein by reference. This loop 2 adaptive control function may employ conventional techniques or, alternatively, the approach of U.S. patent application Ser. No. 10/733,498 filed Dec. 11, 2003 may be employed, the disclosure of which is incorporated herein by reference in its entirety. In this document, the gain adjuster and phase shifter values are referred to as 'alignment settings'. The offsets of the gain adjuster and phase shifter settings from their optimal values are referred to as 'misalignment'. When the offsets from optimal settings are small, the loop is referred to as 'aligned'.

There are many operating conditions that affect the optimal alignment settings. These include both environmental conditions, application specific conditions and system specific conditions. For example, temperature, input power level x(t), carrier frequency, and DC supply voltage will be relevant operating conditions for most applications and these are provided as inputs 226, 214, 230 and 228 as shown in FIG. 2. Time may also be considered as a parameter affecting alignment because of component aging. The loop 1 alignment settings may also affect the optimal loop 2 alignment settings. All of these parameters are measurable within the feed forward power amplifier system and may be monitored by processor 202. In the control system of the present invention, the relevant measurable parameters are used to form an attribute vector. Attribute vectors and the associated settings when the loop is aligned are stored in the alignment list in memory 224. Correlation of the attribute vector to the alignment setting is achieved by the alignment list. The disclosed system combines the alignment list processing with the adaptive controller processing to allow rapid loop alignment.

Next, referring to FIGS. 1–8 a detailed embodiment of the present invention will be described.

First, a preferred embodiment of the manner in which the attribute vector and alignment settings are represented and stored within the alignment list is described. A distance metric for measuring the similarity of attribute vectors is also described. A process for pruning the alignment list is also discussed to allow maintenance of a manageable number of list entries while maintaining coverage of the attribute space. Next the use of the alignment list and the adaptive controller to adjust the loop settings is described. Also the self-generation of elements within the alignment list is described. An alternative alignment list structure based on a hierarchical list structure is then described in relation to FIGS. 6–8.

As described above sets of attribute parameters, or attribute vectors, are employed to allow the feed forward power amplifier system to learn from the past actions. By correlating attribute vectors with past alignment settings, the loop convergence becomes faster and more robust. The attribute parameters that affect the feed forward power amplifier system alignment for a given application are determined in defining the attribute vector. Temperature, average input power, and center frequency are typically important parameters for cellular applications because they are both time-varying and affect the gain. Other parameters such as the modulation format and number of carriers also affect the gain; however, if these parameters are constant over time, they provide little value as part of the attribute vector and may be excluded from the attribute vector.

To determine the similarity of two attribute vectors, a distance measure is employed. The difference (squared or absolute difference) between each parameter is weighted based on its sensitivity with respect to the feed forward power amplifier system gain. That is, parameters with a larger effect on the feed forward power amplifier system gain are weighted more heavily. These sensitivities may be estimated using part specifications or experiments for the particular implementation and application requirements.

Specifically, let the attribute vector for the alignment list element 'n' be defined as $$\overline{p}(n) = [p_0(n) \ldots p_m(n)] \quad \text{(Eq. 1)}$$

where $p_k$ is the value of the attribute parameter 'k' (such as temperature). To ease the implementation of the distance measure on the processor 202, a weighted $L_{inf}$ norm may be used: that is, the distance between elements 'n' and '0', denoted by $d_{attr}(n,\mathbf{0})$, is defined as:

$$d_{attr}(n,\mathbf{0}) = \max_k \{w_k \cdot |p_k(n) - p_k(0)|\} \quad \text{(Eq. 2)}$$

where $w_k$ is the weight for parameter 'k'. Alternative distance measures such as the $L_2$ norm may also be employed. The weighted $L_2$ norm measure of the distance between elements 'n' and '0', denoted by $d_{attr}(n,\mathbf{0})$, is defined as:

$$d_{attr}(n, 0) = \left[ \sum_k \{w_k \cdot |p_k(n) - p_k(0)|^2\} \right]^{0.5} \quad \text{(Eq. 3)}$$

It is also of value to measure the similarity of the alignment settings. Once again, the $L_{inf}$ norm may be used:

$$d_{align}(n,\mathbf{0}) = \max_k \{s_k \cdot |\Delta_k(n,0)|\} \quad \text{(Eq. 4)}$$

where $\Delta_0(n,\mathbf{0}) = \text{VVA}(n) - \text{VVA}(\mathbf{0})$, $\Delta_1(n,\mathbf{0}) = \text{PHS}(n) - \text{PHS}(\mathbf{0})$, where VVA(n) is the nth gain alignment setting, PHS(n) is the nth phase alignment setting and $s_k$ is the respective sensitivity. The sensitivity terms can be chosen such that the distance, $d_{align}$, corresponds to the cancellation residual when [VVA(0), PHS(0)] is the optimal alignment. Once again, alternative distance measures such as the $L_2$ norm may also be employed. The $L_2$ norm measure of $d_{align}$ is:

$$d_{align}(n, 0) = \left[ \sum_k \{s_k \cdot |\Delta_k(n, 0)|^2\} \right]^{0.5} \quad \text{(Eq. 5)}$$

The alignment list structure may be dynamic in nature. Both the list entries and the number of entries may change dynamically. More specifically, along with the attribute vector, the processor 202 tracks the past successful alignment settings. Before implementing the adaptive controller function, processor 202 tests the residual error of the current alignment setting. If it is adequate in terms of cancellation quality, no action is required. If it is not adequate, the alignment setting of the listed element with the closest attribute vector to the current operating condition is retrieved. The residual error for the new setting is then tested. If the cancellation is still not adequate, the adaptive controller generates new alignment settings. After a given loop has converged, with assistance of the adaptive controller, the new alignment setting is added to the alignment list.

It is important to limit the number of elements within the alignment list to limit processor computation time. The simplest method is to establish an upper limit on the number of elements and overwrite the oldest element if a new alignment setting is received. An alternative method is to use pruning. While the processor 202 is not busy processing priority commands, pruning may be preformed. Pruning eliminates redundancies by deleting an older element when its alignment setting is nearly identical to its neighbor (that is, the neighbor of element 'k' has the lowest $d_{attr}(n,k)$ and is considered redundant if $d_{align}(n,k)$ is small). As a result, the number of elements required to represent a region of the attribute space is proportional to the variation in the alignment settings. This list-based approach produces the most compact representation of the attribute-alignment mapping.

Figure 3:
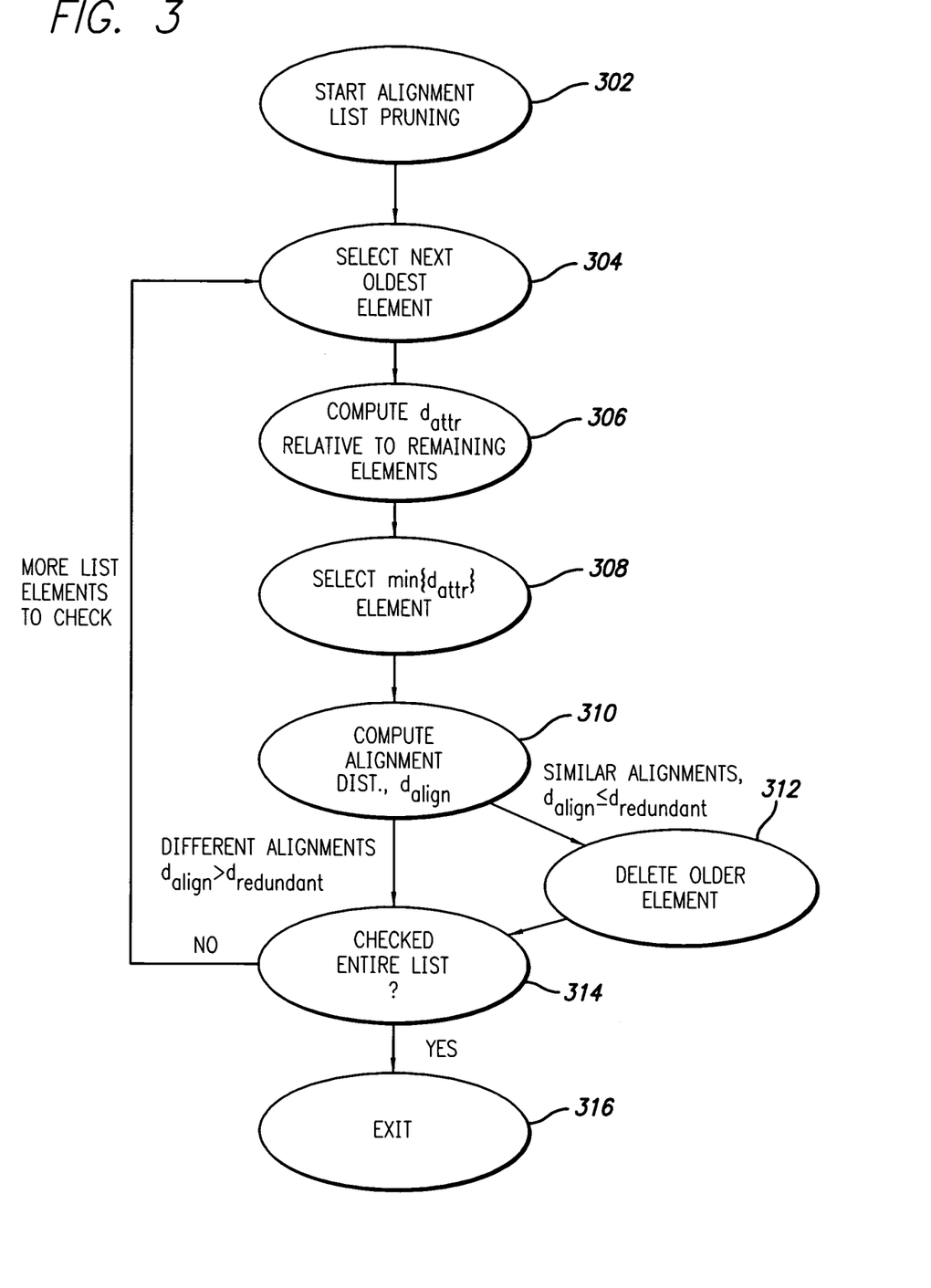
FIG. 3 is a flow diagram of a processing control algorithm showing pruning of an alignment list to remove outdated elements, in accordance with the present invention.

One implementation of a alignment list pruning process flow is shown in FIG. 3, as an example only. As shown the process flow begins at 302 when the processor 202 is not occupied with higher priority tasks. The process flow proceeds to 304 to select the oldest element from the alignment list. Next, the processing determines the nearest element from the remainder of the list using the attribute vector distance measure $d_{attr}$ as defined above by first computing the distance to the remaining elements of the list at 306 and then selecting the element with the minimum distance 308. Next, at 310 the processing flow computes the alignment distance $d_{align}$ as defined above to the selected closest element. If the alignment settings are the same or sufficiently close, the older element is deleted at 312. Sufficiently close depends on the cancellation tolerance and the sensitivity of the cancellation to the respective alignment settings (gain adjuster or phase shifter). For example, a minimum distance $d_{redundant}$ may be employed and if $d_{align}$ is less than or equal to $d_{redundant}$, the older element is deleted while if $d_{align}$ is greater than $d_{redundant}$ both elements are retained. At 314 the process flow checks if the entire list has been checked and if not repeats until the remaining elements are spaced sufficiently apart with respect to the gain adjuster and phase shifter tolerance (or until a lower limit on the list size is reached).

Figure 4:
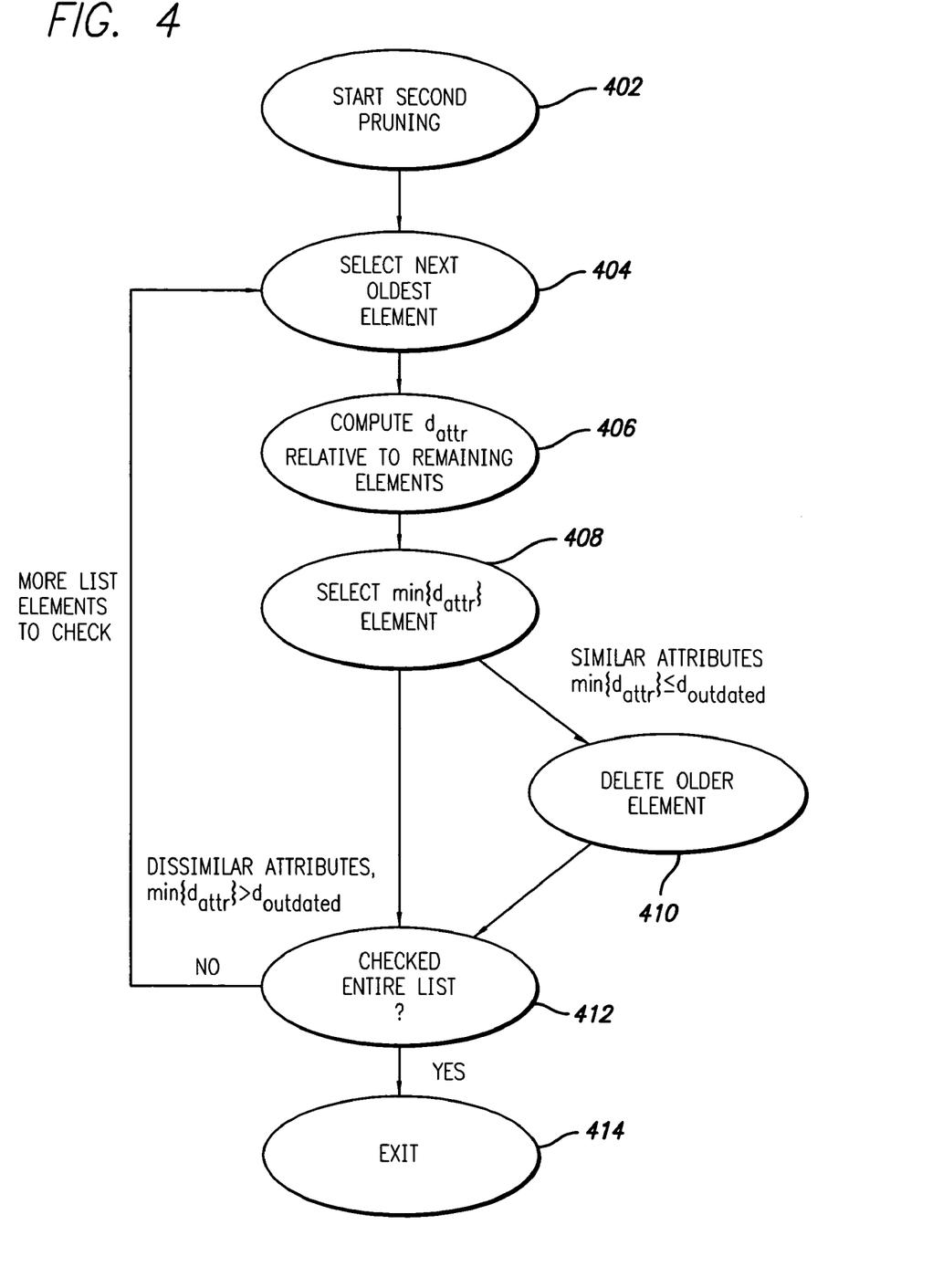
FIG. 4 is a flow diagram of a processing control algorithm showing second pruning of an alignment list to remove outdated elements, in accordance with the present invention.

A second pruning process is shown in FIG. 4. This may be used to delete out-dated elements from the alignment list. For example, component aging may change the relationship between the best alignment setting and a given attribute vector. Small inter-element attribute distances identify potentially out-dated elements. For example, if an element has an incorrect alignment setting, the residual error will be too large, necessitating the use of the adaptive controller function. The adaptive controller will find the new alignment setting. As a result, two different alignments will be listed for a given attribute vector (or two very similar vectors). Deleting the older element resolves any conflict, as well as keeping the list current.

Referring to the specific process flow for this second pruning, shown in FIG. 4, the second pruning processing begins at 402 when the processor is not executing higher priority tasks (including the first pruning processing). At 404 the process flow selects the oldest element in the alignment list which has not already been processed for the second pruning. At 406 the distance $d_{attr}$ is computed for this oldest element to each of the remaining elements in the list. Next at 408 the processing determines the element with the minimum distance $d_{attr}$ to the oldest element. If this minimum distance is less than or equal to a predetermined distance $d_{outdated}$, then at 410 the processing deletes the older of the two elements from the alignment list. If the minimum distance is greater than $d_{outdated}$, however, then these two elements are deemed sufficiently different and both are retained in the alignment list. At 412 the process flow checks if more elements remain to be checked, and if so the process flow returns to 404 to check the next oldest element in the list. When all elements have been checked the second pruning process exits at 414.

Default alignment settings for each loop may be maintained for the case when the alignment list is empty. Also, a factory default alignment setting may be maintained separately so that it will not get pruned.

Figure 5:
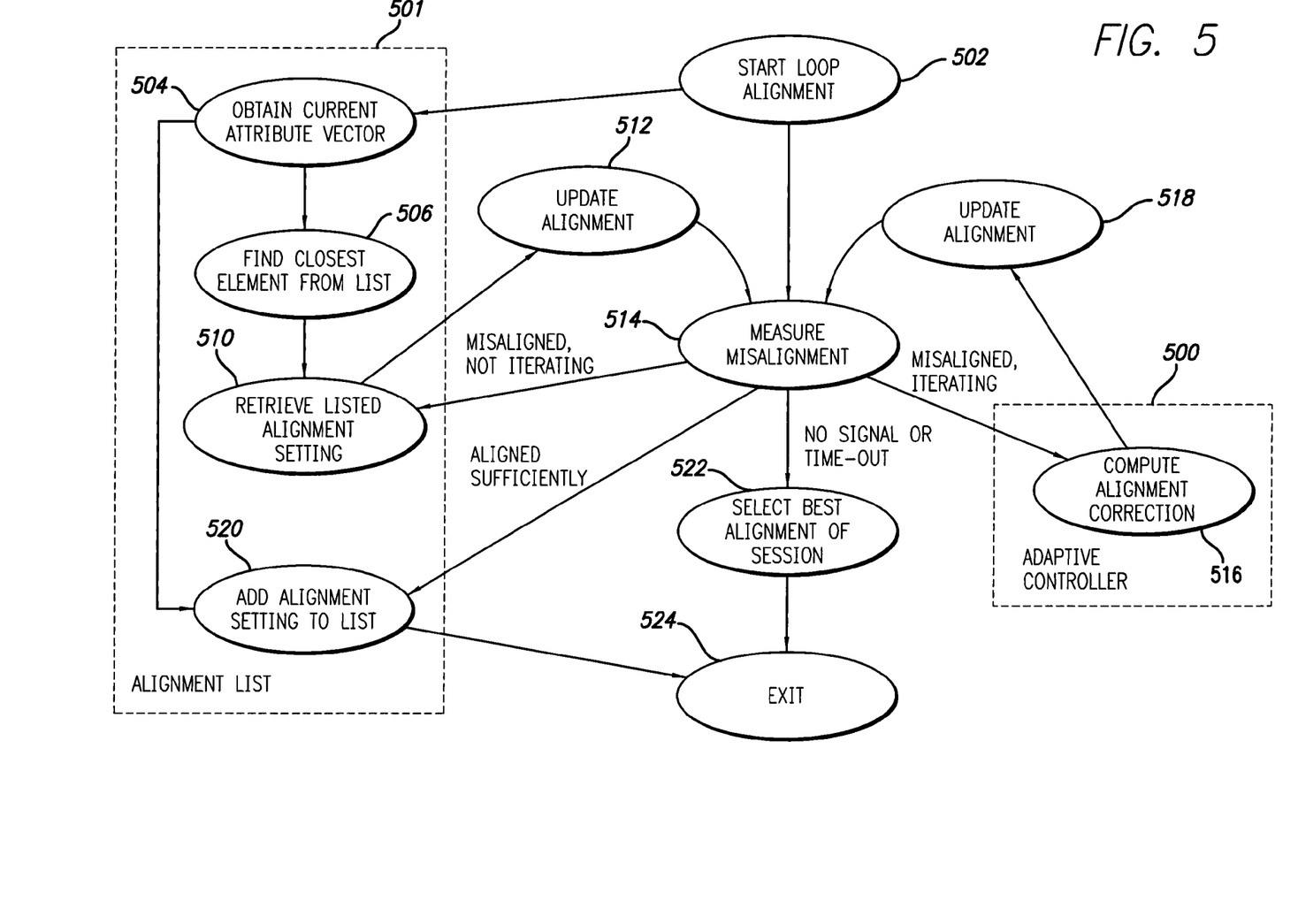
FIG. 5 is a flow diagram of a processing control algorithm showing loop alignment control processing, including interaction between the alignment list processing and adaptive controller processing, in accordance with the present invention.

Next, referring to FIG. 5, the loop alignment control processing is described. Each alignment loop control process (i.e. loop 1 control and loop 2 control) has a similar structure, which is depicted in FIG. 5. The feed forward power amplifier system preferably maintains separate alignment lists for each loop (loop 1 and loop 2 described above in relation to FIG. 1).

As generally shown in FIG. 5, the loop alignment algorithm uses two parallel processes 500 and 501 as well as a process flow which controls the interplay between these two processes. The first process indicated at 501 generates a new alignment setting for initial use in the adaptive loop controller processing 500. This process 501 is employed at start up and is run continuously thereafter to allow use for controller processing when misalignment becomes too large. More specifically, the first process flow 501 continually monitors the current operating condition parameters to obtain the current attribute vector as indicated at 504. For example, the processor may determine current temperature, DC power, carrier frequency, and input power to determine the current attribute vector for the current operating conditions. Then at 506 the process flow checks the alignment list for the list element with the smallest attribute distance from the current vector. This list element alignment setting (loop 1 or loop 2 alignment setting) is then retrieved at 510. Whether or not this retrieved alignment setting is used to update the alignment for the adaptive controller processing 500 may be controlled by misalignment measurement processing 514 and the change in the retrieved element. At start up and whenever the measured misalignment is too great the alignment list setting is retrieved and used to update the alignment at 512. The adaptive controller processing 500 is then initiated and the adaptive controller then computes the alignment correction at 516 using an iterative controller algorithm for loop 1 or loop 2, such as described previously.

For example, this process flow may be controlled by a status flag. If the element retrieved at 510 changes, a status flag is cleared indicating that the system is 'not iterating'. The process flow also continually measures the level of misalignment at 514. If the misalignment is too large, the status flag is checked. If the flag is clear, a significant change in the attribute vector is indicated, and the alignment is updated using the new setting retrieved from the alignment list. After retrieving the new setting, the status flag is set to start the iterative adaptive controller process. If the flag is set already, the adaptive controller process 500 is requested which computes the loop misalignment at 516 in terms of differential adjustments. The alignment is updated at 518, and the iterative process is repeated until the loop is aligned. If the measured misalignment after completing the adaptive controller processing is small, the alignment setting and the current attribute vector are stored in the alignment list at 520. The loop alignment routine is then complete. At this point, a different loop can be aligned or the various alignment lists can be pruned as described previously. At system shut down or after a timeout, the best alignment setting of the session may be selected at 522, which may be stored and used to initiate a rapid start up.

Figure 6:
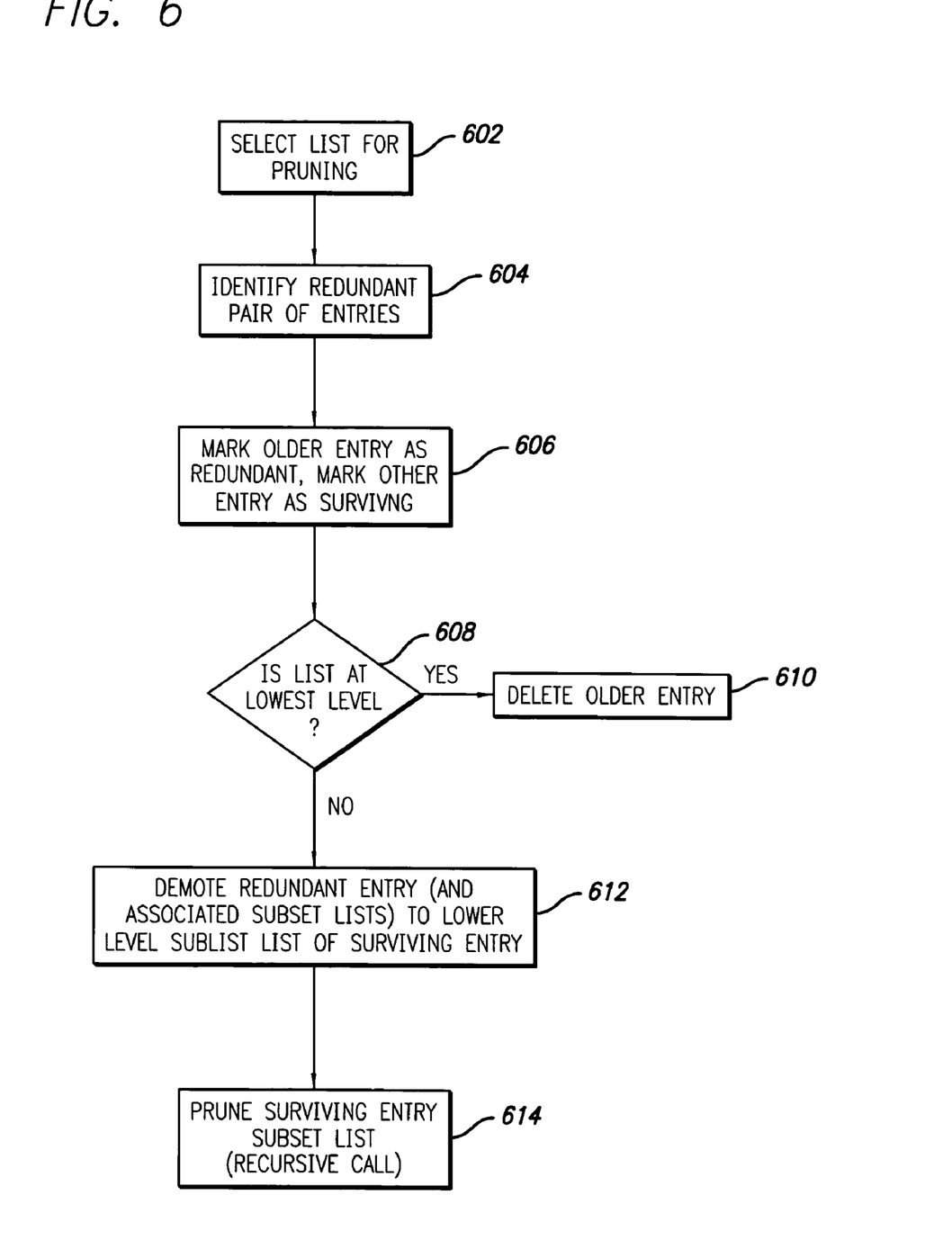
FIG. 6 is a flow diagram of a processing control algorithm showing generation of a hierarchical alignment list structure, in accordance with the present invention.
Figure 7:
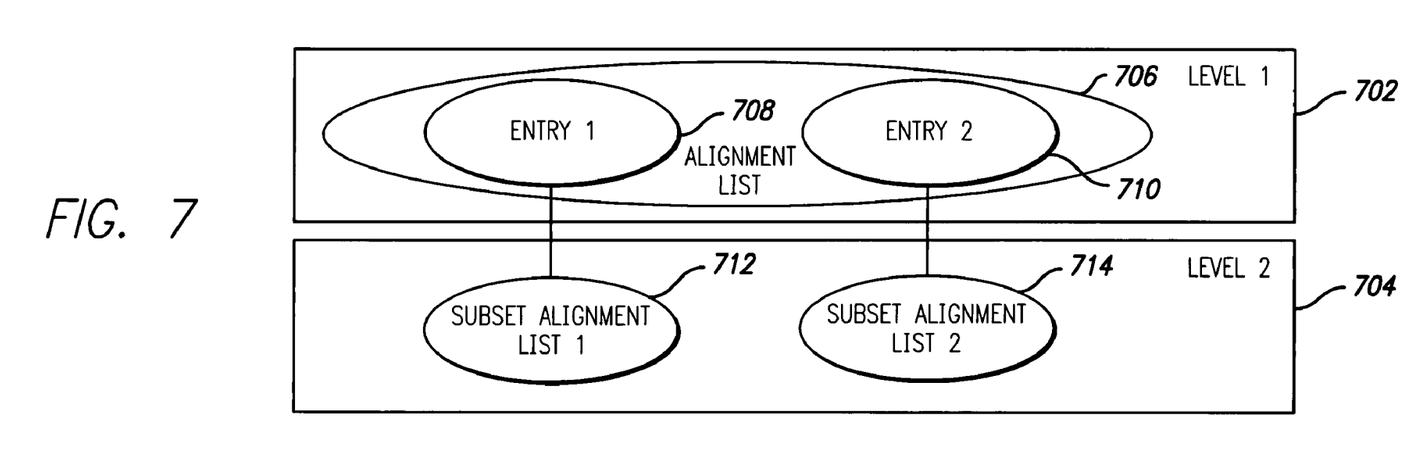
FIG. 7 is a schematic illustration of the hierarchical alignment list structure before demoting an entry.
Figure 8:
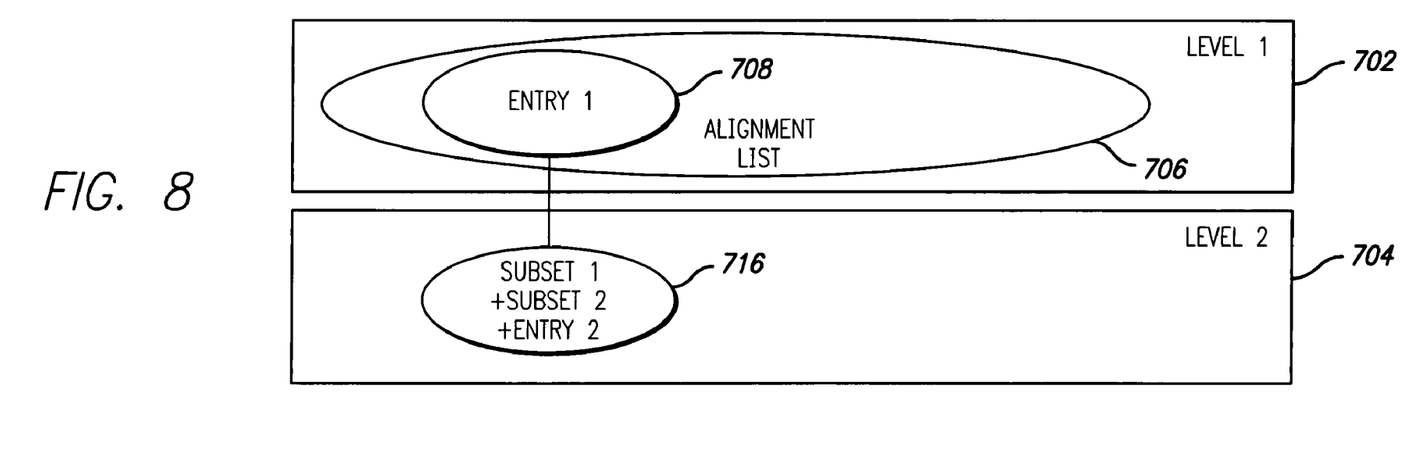
FIG. 8 is a schematic illustration of the hierarchical alignment list structure after demoting an entry.

Referring to FIGS. 6–8 an additional optional feature of the alignment list processing is illustrated using a hierarchy of elements. In the above-mentioned approach there is a trade-off when selecting the number of elements within a list. The benefit of allowing a large number of elements is dense coverage of the attribute space. However, the benefit of a small number of elements is that less time is required to determine the element with the minimum attribute distance from the current vector. Using a hierarchical alignment list structure allows both dense coverage and rapid search.

The use of pruning may be used to generate the hierarchical alignment lists as shown in FIGS. 6–8. During the redundancy pruning described previously, when two elements are determined to be 'similar', the older element becomes redundant and is deleted and only the other element survives. In a hierarchical approach to list management, the redundant element is not deleted; instead it is 'demoted' to a lower level subset below the surviving element. The creation of lower subsets is recursive, which allows as many levels as necessary to be defined. (In most cases, zero or one subset level would be adequate).

The basic pruning process flow employed to generate hierarchical alignment lists is shown in FIG. 6. At 602 the pruning commences when the processor is not occupied by higher priority tasks. At 604 a redundant pair of entries are identified. This process 604 may follow the same distance computation described in relation to FIG. 3 (at 304, 306, 308 and 310). At 606 the older entry is marked as the redundant entry and the other is maintained at its current level in the hierarchical list structure. At 608 the pruning process flow checks if the list is at the lowest level. If it is then at 610 the redundant entry is deleted. If the list is not at the lowest level then the redundant entry is demoted at 612 to the next lower level. Its location in the lower level is marked as a sublist entry of the surviving entry in the higher level. Next the pruning process flow proceeds to the next lower level at 614 and processing 602 begins at that level for the current entry sublist Redundant elements can have subsets. This type of hierarchical structure is shown in FIG. 7 and FIG. 8. Before the redundant element 710 is demoted, its lower level subset list 714 is merged with the surviving element's subset list 712 (at the same level). The redundant element 710 is then demoted to a lower level 704. Merging subsets at equal levels causes the subsets to become too large in the short term; however, as the pruning process is initiated, the subsets sizes will return to the desired value.

In the hierarchical list, the highest level 702 preferably has the coarsest sampling (largest value for the threshold $d_{align}$). Lower levels have increasingly finer resolutions (smaller $d_{align}$). By adjusting the threshold $d_{align}$ for each level, it is possible to adjust the number of entries in a given alignment list at a given level. By increasing $d_{align}$, the number of entries in the list decreases. It is desirable to have all of the lists at the various levels of the hierarchical structure having a nearly equal number of entries.

The loop alignment process flow for hierarchical lists may generally follow the process flow 501 of FIG. 5 as described above. However, the search for the element with the minimum attribute distance at 506 is restricted to one set; this set is referred to as 'active'. When a search 506 begins, the top-level set is active. The search for the alignment setting nearest to the current attribute vector first finds the nearest entry in the highest level list, then searches that entry's subset list. Once the element with the minimum attribute distance within the top-level is identified, its alignment is retrieved (as described above in relation to FIG. 5). However, instead of requesting the adaptive controller as above, the element's next lower level subset becomes active. The next lower level subset is then searched for the element with the minimum attribute distance, and a new alignment setting is retrieved. The process repeats recursively until the next lower subset is empty. At this point the adaptive controller is requested and the adaptive controller uses the retrieved alignment setting. This process is repeated recursively until the bottom level is reached. If any of the intermediate settings provides sufficient alignment quality, the process is halted before requesting the adaptive controller. Note that the subset search should include the parent entry (or parent entries if two or more levels below the top) because it may be the best match.

The complexity of the search time is proportional to the product of the number of entries per list (N) and the number of levels in the hierarchy (L). In contrast, the exhaustive search is proportional to N to the power of L, which will in general be significantly higher. (This assumes that each list has N entries. Note that level L has N times more subset lists than level L-1, which means that level L has N to the power of L entries in total).

Note that elements deleted as part of the second pruning process described in relation to FIG. 4 above are out-dated, and hence, should not be saved in a lower level set.

To summarize the foregoing, the disclosed system combines multi-dimensional alignment list processing and adaptive controller processing to align the control loops of a feed forward amplifier system. The two processes are coupled in a novel manner to improve the dynamic response of the system. The multi-dimensional alignment list used in the disclosed approach has a different structure compared to an array-based look-up table, thus avoiding the above-mentioned problems of look-up tables. Instead of storing the elements using an array structure, the elements are collected as a set. Each element has the following: (a) a set of parameters or attributes corresponding to the operating conditions affecting the amplifier; and (b) the best alignment setting found under those operating conditions. A metric is formed which defines the 'distance' between two elements, which is based on the differences between the elements' attributes. If the feed forward system detects misalignment in a given loop, the attributes associated with the current operating conditions are measured. Next, the element in the alignment list with the minimum distance from the current attributes is identified and its corresponding alignment setting is retrieved from storage. If the new alignment setting is not adequate, the adaptive controller is activated to further improve the loop alignment. Once the alignment is deemed sufficiently close to optimal value, the alignment setting along with the current attributes are combined to form to a new element within the set. Thus, the alignment lists are self-generating.

To limit the computational complexity of the search for the minimum distance element, it is desirable to limit the size of the element set. To identify redundant elements, the similarity of elements is measured in terms of attribute distance and alignment separation (performed during idle times). If the set size exceeds a preset number, the oldest of a pair of similar elements is deleted. By limiting the list size, the time to determine the element with the minimum distance to the current attributes is controllable. If additional elements are desired for greater coverage, it is possible to form a hierarchy of list levels. Instead of deleting the oldest similar element, it is 'demoted' to a lower level subset below the surviving element. If a demoted element contains its own lower level subsets, they are merged with the surviving element's subsets. The creation of lower subsets is recursive, which allows as many levels as necessary to be defined. (In most cases, zero or one subset level would be adequate).

The hierarchical structure allows the search for the minimum distance element to be computationally efficient because each active set is limited in size. Initially, the highest-level set is active. If the element with the minimum distance from the highest-level set does not produce an adequate alignment, then its subset (if it exists) becomes active. The minimum distance match from the lower level subset is tested for alignment quality. The subsets are recursively searched until the alignment quality is sufficient or the next lower subset is empty. For the latter case, the adaptive controller would be activated to improve the alignment.

The combined operation of an adaptive feed forward controller and the disclosed alignment list gives the disclosed amplifier system the ability to learn from its experiences and to improve its performance in the presence of dynamic conditions such as varying input power levels, changing (or hopping) carrier frequencies, changing temperature or DC supply, or component aging. The system can accommodate any number of attributes (multi-dimensional index space) without a significant increase in complexity. The hierarchical set management allows an arbitrarily large number of elements to be stored without significantly increasing the worst-case delay in finding the element with the minimum attribute distance.

Another advantage of the approach for the adaptation of the first loop (carrier cancellation) is that the transient power through the error amplifier, occurring when the input power increases abruptly, is minimized, thereby reducing the likelihood of damage. This is particularly important for the amplifier designs which use a small error amplifier. For the adaptation of the second loop in a pilotless implementation, this approach provides a stable default when spurious detection is not possible. Once again, this is a benefit for some amplifier designs.

An additional benefit of the disclosed alignment list is that the attribute space can be sampled unevenly. In general, the sensitivities of the gain and phase settings vary over the attribute space. The disclosed system will naturally produce a higher density of elements in the regions with higher sensitivity, as desired.

The alignment lists provided by the present invention are useful for dynamic waveforms. For example, one application for a feed forward power amplifier system is for a hopping beacon. In such applications the alignment settings for each carrier may be stored to allow for fast hopping (relative to the typical PA settling time).

In view of the above it will be appreciated that the present invention provides a number of advantageous features. The combined use of alignment lists and adaptive controller processing provides rapid alignment of the loops within a feed forward power amplifier system. The self-generating nature of the alignment list allows the system to learn from past experiences, reducing the search time required by the adaptive controller. The transient energy surges are reduced and the adaptive controller becomes more robust when provided with good initial estimates of the gain and phase settings. The hierarchical structure of the alignment list allows the search for the minimum distance element to be computational efficient while providing wide coverage of the attribute space.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A feed forward amplifier system, comprising:
an input for receiving an RF input signal;
a first control loop coupled to the input and comprising a main amplifier, a main amplifier sampling coupler, a delay element, and a cancellation combiner;
a second control loop coupled to the first control loop and comprising a first signal path, a second signal path comprising an error amplifier, and an error coupler coupling the first and second signal paths;
an output coupled to the error coupler; and
means for controlling at least one of the first and second control loops employing a stored alignment list having a plurality of stored list elements, each element having an alignment setting and a collection of parameters characterizing the operating condition of the feed forward amplifier system.

2. A feed forward amplifier system as set out in claim 1, wherein said first control loop further comprises a gain adjuster and a phase adjuster and wherein each said alignment setting comprises a loop 1 gain adjuster setting and a loop 1 phase adjuster setting.

3. A feed forward amplifier system as set out in claim 1, wherein said second control loop further comprises a gain adjuster and a phase adjuster and wherein each said alignment setting comprises a loop 2 gain adjuster setting and a loop 2 phase adjuster setting.

4. A feed forward amplifier system as set out in claim 1, wherein said collection of parameters characterizing the operating condition of the feed forward amplifier system comprises one or more of temperature, DC power supply, input signal power and input signal carrier frequency.

5. A feed forward amplifier system as set out in claim 4, wherein said collection of parameters characterizing the operating condition of the feed forward amplifier system are defined as an attribute vector and a distance is defined between any two attribute vectors.

6. A feed forward amplifier system as set out in claim 5, wherein said means for controlling obtains a current attribute vector and computes the distance to the attribute vectors of the list elements and selects the list element with the least distance for use as an alignment setting in the control function.

7. A feed forward amplifier system as set out in claim 6, wherein said means for controlling continually measures misalignment of the feed forward amplifier system and retrieves an alignment setting from said alignment list when said measured misalignment exceeds a predetermined value.

8. A feed forward amplifier system as set out in claim 7, wherein said means for controlling employs a selected element as an initial alignment setting and computes a new alignment setting from the initial setting employing an iterative control algorithm.

9. A feed forward amplifier system as set out in claim 8, wherein said means for controlling updates said alignment list with a new alignment setting after completing said iterative computation.

10. A feed forward amplifier system as set out in claim 5, wherein the distance between closest list element attribute vectors varies throughout the list.

11. An adaptive controller for controlling a loop of an amplifier system, comprising:
one or more inputs for receiving one or more attribute parameters corresponding to current operating conditions of the amplifier system; and
one or more processors coupled to said one or more inputs and having an associated stored alignment list and programmed with an alignment list algorithm and a controller algorithm to provide loop adjustment settings to control the loop of the amplifier system, wherein said alignment list algorithm generates said list with adjustment settings computed by said controller algorithm and associates one or more stored attribute parameters with each stored adjustment setting.

12. An adaptive controller for controlling a loop of an amplifier system as set out in claim 11, wherein said alignment list algorithm selects an alignment setting from said alignment list for use by said controller algorithm at start up or when the loop becomes sufficiently misaligned.

13. An adaptive controller for controlling a loop of an amplifier system as set out in claim 12, wherein said alignment list algorithm selects an alignment list adjustment setting for use by said controller algorithm by computing the distance between the one or more attribute parameters corresponding to current operating conditions and the attribute parameters associated with each of the alignment settings in the list and selecting the alignment setting corresponding to the attribute parameter with the minimum distance.

14. An adaptive controller for controlling a loop of an amplifier system as set out in claim 13, wherein the distance computation is weighted with different weights for different attribute parameters.

15. An adaptive controller for controlling a loop of an amplifier system as set out in claim 14, wherein the distance $d_{attr}$ between two sets of attribute parameters "n" and "0", is defined by the weighted $L_{inf}$ norm distance measure or the weighted $L_2$ norm distance measure.

16. An adaptive controller for controlling a loop of an amplifier system as set out in claim 11, wherein the attribute parameters comprise one or more of temperature, DC supply voltage, input signal power and input signal carrier frequency.

17. An adaptive controller for controlling a loop of an amplifier system as set out in claim 11, further comprising one or more inputs for receiving alignment data.

18. An adaptive controller for controlling a loop of an amplifier system as set out in claim 17, wherein said one or more inputs for receiving alignment data comprises a pilot signal input.

19. An adaptive controller for controlling a loop of an amplifier system as set out in claim 17, wherein said one or more inputs for receiving alignment data comprises an input for loop test data.

20. An adaptive controller for controlling a loop of an amplifier system as set out in claim 11, wherein said adjustment settings comprise gain adjuster and phase adjuster settings.

21. A method for controlling an amplifier system having a control loop comprising a control loop input, a first signal path, a second signal path, and a control loop output, at least one of said first and second signal paths including an amplifier, said method comprising:

providing a list of alignment settings, each alignment setting having an associated operating condition;
detecting the current operating conditions of the amplifier system;
comparing the current operating conditions to those in the list of alignment settings; and
selecting the alignment setting associated with the most similar operating condition in the list.

22. A method for controlling an amplifier system as set out in claim 21, wherein the relevant operating conditions are configured as a multi-dimensional attribute vector.

23. A method for controlling an amplifier system as set out in claim 22, wherein said comparing comprises measuring a distance between the current attribute vector and each of the attribute vectors of the list.

24. A method for controlling an amplifier system as set out in claim 23, wherein said selecting comprises determining the attribute vector having minimum distance from the current operating condition attribute vector.

25. A method for controlling an amplifier system as set out in claim 23, wherein the spacing of the stored adjustment settings, as defined by the attribute vector distance, varies through the list.

26. A method for controlling an amplifier system as set out in claim 25, wherein a higher density of adjustment settings is provided in regions of the list where the alignment is most sensitive to one or more operating conditions comprising the attribute vector.

27. A method for controlling an amplifier system as set out in claim 21, further comprising computing a new alignment setting employing an iterative loop controller algorithm, wherein the alignment setting associated with the most similar operating condition is used as the initial alignment setting for the adaptive loop controller algorithm.

28. A method for controlling an amplifier system as set out in claim 27, further comprising updating the alignment list with a new alignment setting computed by the adaptive loop controller algorithm.

29. A method for controlling an amplifier system as set out in claim 21, wherein the size of the alignment list is dynamic.

30. A method of maintaining a list of alignment settings of a control loop of an amplifier system, said list comprising a plurality of elements each element having an alignment setting and a set of parameters corresponding to operating conditions of the amplifier system, said method comprising:
selecting an element of the alignment list;
determining the element of the alignment list having the most similar corresponding operating conditions to the selected element;
determining if the two elements are sufficiently similar to be considered redundant; and
deleting the oldest of the two elements of the alignment list if the elements are redundant.

31. A method of maintaining a list of alignment settings of a control loop of an amplifier system as set out in claim 30, wherein said selecting an element of the lignment list comprises selecting the oldest element of the list not previously subject to list maintenance processing.

32. A method of maintaining a list of alignment settings of a control loop of an amplifier system as set out in claim 30, wherein said determining the element of the alignment list having the most similar corresponding operating conditions to the selected element comprises determining a distance measure to the operating condition parameter values of each of the remaining elements of the alignment list and selecting the element having the minimum distance.

33. A method of maintaining a list of alignment settings of a control loop of an amplifier system as set out in claim 32, wherein said distance measure comprises a weighted difference between parameter values corresponding to operating conditions.

34. A method of maintaining a list of alignment settings of a control loop of an amplifier system as set out in claim 33, wherein said parameters corresponding to operating conditions of the amplifier system comprise one or more of temperature, DC power supply, input signal power and input signal carrier frequency.

35. A method of maintaining a list of alignment settings of a control loop of an amplifier system as set out in claim 32, wherein said determining if the elements are sufficiently similar to be considered redundant comprises comparing the distance between the operating condition parameters of the two elements to an outdated distance threshold.

36. A method of maintaining a list of alignment settings of a control loop of an amplifier system as set out in claim 30, wherein said determining if the elements are sufficiently similar to be considered redundant comprises determining a distance measure between the alignment settings and comparing the alignment distance to a redundant distance threshold.

37. A method of maintaining a list of alignment settings of a control loop of an amplifier system as set out in claim 30, further comprising repeating said list maintenance processing for each element of the alignment list.

38. A method of generating a hierarchical list of alignment settings of a control loop of an amplifier system, said list comprising a plurality of elements each element having an alignment setting and a corresponding set of parameters corresponding to operating conditions of the amplifier system, said list having a hierarchical structure comprising at least two levels, said method comprising:
   selecting an element in a first level of the alignment list;
   determining the element of the first level of the alignment list having the most similar corresponding operating conditions to the selected element; and
   demoting the oldest of the two elements to a lower level of the hierarchical alignment list.

39. A method of generating a hierarchical list of alignment settings of a control loop of an amplifier system as set out in claim 38, wherein said determining the element of the alignment list having the most similar corresponding operating conditions to the selected element comprises determining a distance measure to the operating conditions of each of the remaining elements of the first level of the alignment list and selecting the element having the minimum distance.

40. A method of generating a hierarchical list of alignment settings of a control loop of an amplifier system as set out in claim 38, further comprising determining if the two elements are redundant, wherein said older element is only demoted if the elements are redundant.

41. A method of generating a hierarchical list of alignment settings of a control loop of an amplifier system as set out in claim 38, further comprising repeating said list processing for each level of the hierarchical list.

42. A method of generating a hierarchical list of alignment settings of a control loop of an amplifier system as set out in claim 41, wherein said older entry is deleted if the list maintenance processing is at the lowest level of the hierarchy.

43. A method of generating a hierarchical list of alignment settings of a control loop of an amplifier system as set out in claim 38, wherein said demoted element is associated as a subset list entry of the redundant element not demoted.

44. A method of generating a hierarchical list of alignment settings of a control loop of an amplifier system as set out in claim 43, wherein an element being demoted and having a subset list is merged with the subset list of a redundant element not demoted.

45. A method for controlling an amplifier system having a control loop comprising a control loop input, a first signal path, a second signal path, and a control loop output, at least one of said first and second signal paths including an amplifier, said method comprising:
   providing a hierarchical list of alignment settings having at least two levels, each alignment setting having an associated operating condition and some or all of the alignment settings in a highest level having subset alignment settings in a lower level;
   detecting the current operating conditions of the amplifier system;
   comparing the current operating conditions to those in the highest level of the hierarchical list of alignment settings;
   selecting the alignment setting associated with the most similar operating condition in the highest level of the list;
   comparing the current operating conditions to those in the subset of the selected highest level alignment setting;
   selecting the alignment setting of the subset with the most similar operating condition; and
   selecting the alignment setting in the higher or lower level having the most similar operating condition to the current operating condition.

46. A method for controlling an amplifier system as set out in claim 45, further comprising repeating the processing for each level of the hierarchical list until the next lower subset is empty.

47. A method for controlling an amplifier system as set out in claim 45, wherein the highest level has a coarser spacing of alignment settings than the lower level.

48. A method for controlling an amplifier system as set out in claim 47, wherein any two alignment settings have an alignment distance and wherein the highest level has a larger alignment distance between settings than said lower level.

49. A method for controlling an amplifier system as set out in claim 47, wherein said alignment distance is a weighted difference between the adjustment settings.

50. A method for controlling an amplifier system as set out in claim 49, wherein the adjustment settings are a gain adjustment and phase adjustment setting and wherein the weighting is an alignment sensitivity.

* * * * *

UNITED STATES PATENT AND TRADEMARK OFFICE
CERTIFICATE OF CORRECTION

PATENT NO. : 6,985,706 B2  
APPLICATION NO. : 10/761788  
DATED : January 10, 2006  
INVENTOR(S) : Richard Neil Braithwaite It is certified that error appears in the above-identified patent and that said Letters Patent is hereby corrected as shown below:

The Assignee location should read as follows: "Santa Ana, California (US)".

On the title page item (73), should read

-- Powerwave Technologies, Inc.  Santa Ana, California (US) --

Signed and Sealed this

Eighth Day of August, 2006

JON W. DUDAS  
*Director of the United States Patent and Trademark Office*